United States Patent [19]

Tazuke et al.

[11] 4,226,967
[45] Oct. 7, 1980

[54] HIGHLY CHARGE-TRANSFERABLE POLYCONDENSATION POLYMER AND PROCESS FOR PREPARATION

[75] Inventors: Shigeo Tazuke, Yokohama; Hajime Nagahara, Fuji, both of Japan

[73] Assignee: Asahi Kasei Kogyo Kabushiki Kaisha, Osaka, Japan

[21] Appl. No.: 34,700

[22] Filed: Apr. 30, 1979

[30] Foreign Application Priority Data

Apr. 28, 1978 [JP] Japan ................................ 53-49749

[51] Int. Cl.$^2$ ...................... C08G 18/32; C08G 18/62
[52] U.S. Cl. ...................................... 528/74; 430/900; 430/58; 430/72; 525/127; 525/424; 525/440; 528/73; 526/258; 526/310
[58] Field of Search ................... 525/424, 440, 127; 204/159.22, 159.23; 430/900; 528/74

[56] References Cited

U.S. PATENT DOCUMENTS

| | | | |
|---|---|---|---|
| 3,791,824 | 2/1974 | Bauer et al. | 430/900 |
| 4,007,043 | 2/1977 | Stolka et al. | 430/900 |
| 4,013,623 | 3/1977 | Turner et al. | 430/900 |

OTHER PUBLICATIONS

Kamogawa, J. Polymer Science, A-1, 4, 2281, (1966),
Litt et al., J. Polymer Science, Polym. Chem. Ed., 11, 1339, 1359, (1973).
Rembaum et al., J. Polymer Science, A-1,6, 1955, (1968).
Hatamo et al., Makromol. Chem. 175, 57, (1974).
Mikawa et al., Bull. Chem. Soc. Japan, 48, 1362, (1975).
Iwatsuki et al., J. Polymer Science, Polym. Chem. Ed., 10,3329, (1970), Iwatsuki et al., Makromol. Chem., 178, 2307, (1977).

*Primary Examiner*—H. S. Cockeram
*Attorney, Agent, or Firm*—Sughrue, Rothwell, Mion, Zinn and Macpeak

[57] ABSTRACT

An electron acceptor polycondensation polymer of the formula (I)

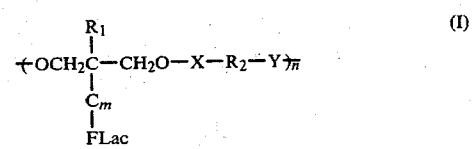

wherein $R_1$ is a hydrogen atom or an alkyl group, an aryl group or an aralkyl group having not more than 15 carbon atoms; $C_m$ is a divalent connecting group; FLac is an electron acceptor group having a fluorene nucleus as its basic structure; X and Y are a carbonyl group or an acid amide group forming a urethane linkage with the oxygen atom of the diol; $R_2$ is a bifunctional organic residue having not more than 20 carbon atoms, n is a number greater than 10 which represents the degree of polycondensation of the resultant polycondensation polymer.

10 Claims, No Drawings

HIGHLY CHARGE-TRANSFERABLE POLYCONDENSATION POLYMER AND PROCESS FOR PREPARATION

BACKGROUND OF THE INVENTION

1. Field of the Invention

This invention relates to a novel highly charge-transferable polycondensation polymer, and more particularly, to a novel electron acceptor polycondensation polymer and a high molecular charge transfer complex comprising the same.

2. Description of the Prior Art

Many studies have heretofore been made on charge transfer polymers containing a variety of easily charge-transferable moieties within the main chain or side chain, and these studies have yielded poly-(N-vinylcarbazole) and many other types of charge transfer polymers. However, the field that most interests people working on charge transfer polymers is the high molecular charge transfer complexes, and in this particular field, very little is known about the relationship between various characteristics of the high molecular charge transfer complex and its molecular structure, and therefore, as is well known, the resulting polymer is far from being "tailor-made".

The present inventors have spent considerable effort in unravelling the mechanism of charge transfer and found several new phenomena that are a significant contribution to the science of charge transfer. Based on these findings, the present inventors have studied the relationship between the structure of a charge transfer polymer and the stability and the photoconductivity of a high molecular charge transfer complex. The present invention which will be described hereinafter is the result of this study.

SUMMARY OF THE INVENTION

It is, therefore, one object of this invention to provide a novel electron acceptor polycondensation polymer.

It is another object of this invention to provide a high molecular charge transfer complex comprising said electron acceptor polycondensation polymer and an electron donor.

It is a further object of this invention to provide a novel photoconductive polymer having the properties of both a p-type and n-type photoconductor.

The first object of this invention, i.e., a novel electron acceptor polycondensation polymer, has been attained through molecular design by considering the fact that the stability of a charge transfer complex largely depends on the distance by which the electron transfer functional groups in a side chain are spaced from one another and the regularity of their arrangement as well as the distance by which such a functional group is spaced from the main chain. The second object of this invention, i.e., a novel high molecular charge transfer complex comprising polymeric electron acceptor and a donor with a unique photoconductive behavior, has been achieved based on the finding that the geometrical configuration of a charge transfer group is an important factor in the production of such polymeric charge transfer complex.

DETAILED DESCRIPTION OF THE INVENTION

The electron acceptor polycondensation polymer of this invention comprises a repeating unit of the formula (I):

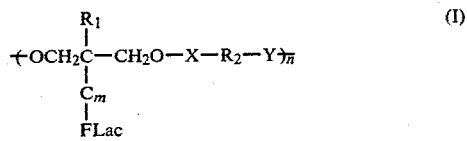

wherein $R_1$ is a hydrogen atom or an alkyl group, an aryl group or an aralkyl group; $C_m$ is a divalent connecting group; FLac is an electron acceptor group comprising a fluorene nucleus as its basic structure; X and Y are a carbonyl group and an acid amide group, respectively, forming a urethane linkage with the oxygen atom of the diol; $R_2$ is a divalent organic residue group having up to 20 carbon atoms; and n is a number from about 10 to 300 which represents the degree of polycondensation of the resultant polycondensation polymer.

The alkyl group $R_1$ may be a straight chain, branched chain or cyclic alkyl group having 1 to 8 carbon atoms such as a methyl group, an ethyl group, a propyl group, a butyl group, a hexyl group, an isopropyl group, a cyclohexyl group, etc., and is preferably an ethyl group.

The aryl group $R_1$ may be a substituted or unsubstituted aryl group having 6 to 10 carbon atoms such as a phenyl group, a naphthyl group, a p-methylphenyl group, etc., and is preferably a phenyl group.

The aralkyl group $R_1$ has 7 to 15 carbon atoms such as a benzyl group, a naphthylmethyl group, a p-methylbenzyl group, an anthrylmethyl group, etc., and is preferably a benzyl group.

The divalent organic residue $R_2$ may be a straight chain or branched chain alkylene group having 1 to 20 carbon atoms, a group having 3 to 20 carbon atoms which contains an alicyclic group or an arylene group (e.g., a phenylene group), an ether or a thioether group having 4 to 10 carbon atoms and is preferably an alkylene group having 1 to 20 carbon atoms.

As can be seen from the formula (I), the electron acceptor polycondensation polymer of this invention is characterized by the distance of an electron acceptor group from the main chain of the polymer and by the periodic arrangement of such electron acceptor groups. To be more specific, this invention requires that the distance that separates adjacent fluorene nucleus centers when the polymer is extended in a zigzag chain along its main chain is more than 10 Å whereas each fluorene nucleus is coupled to the main chain at a distance of one to 10 atoms.

In the formula (I) which describes the electron acceptor polycondensation polymer according to this invention, $R_2$ forms part of the main chain and governs the distance between two adjacent electron acceptor groups. However, due to the geometrical configuration of the fluorenyl group and the limitation on the polymerization solvent used, $R_2$ is preferably a methylene chain having about 2 to 10 carbon atoms, and corresponding derivatives containing a methylene chain such as a diisocyanate, a dicarboxylic acid or a functional derivative thereof can be advantageously used for the purpose of this invention. The term "functional derivative" includes acid anhydrides, esters, amides, acid chlorides, for example, dichlorides, diethyl esters or dithiophenol esters of succinic acid, adipic acid, sebacic acid or the like, succinic anhydride, etc.

The electron acceptor fluorene nucleus FLac which is a characteristic element of the polymer of this invention has the following formula (II):

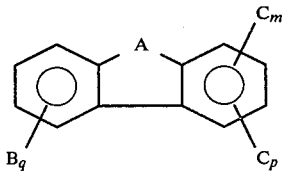
(II)

wherein A is

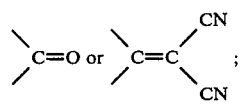

B and C are each an electron attracting group selected from the group consisting of —NO$_2$, halogen, —CN and —CF$_3$; q and p are each an integer of from 0 to 4.

C$_m$ is a divalent connecting group such as —(CH$_2$)$_i$—, —COO—, —CONH—, —O— wherein i is an integer of 1 to 10 or a combination thereof, C$_m$ having preferably a 3 to 4 atom chain length and bonded with the fluorene nucleus at a selected site, generally at the 2- or 7-position. Examples of 3 to 4 carbon atom length chains C$_m$ are —CH$_2$OCO— and —CH$_2$CH$_2$OCO—.

FLac is preferably a 4,5,7-trinitro-9-oxo-2-fluorenyl group.

While the ability of an electron acceptor group to transfer a charge easily is not particularly critical or characteristic of the fluorene nucleus, it is, for the purpose of this invention, expressed in terms of an ionization potential of 10 eV or higher or an electron affinity of 0.5 eV or higher. What is characteristic of the fluorene nucleus defined according to this invention is the resonance stability of electron structure by virtue of its geometrical configuration and complementary formation with a carbazole derivative which is a good electron donor.

The present inventors have found a practical method of preparing the electron acceptor polycondensation polymer of this invention having a fluorene nucleus, which is described hereinbelow:

A propane diol having an electron acceptor fluorenyl group in the side chain as shown in formula (III) is reacted with a diisocyanate having 4 to 20 carbon atoms (e.g., ethylene diisocyanate, hexamethylene diisocyanate, xylylene diisocyanate, etc.), a dicarboxylic acid dichloride having 3 to 20 carbon atoms (e.g., succinic acid dichloride, adipic acid dichloride, sebacic acid dichloride, etc.), a dicarboxylic acid anhydride having 3 to 20 carbon atoms (e.g., succinic anhydride, etc.), or a dicarboxylic acid having 3 to 20 carbon atoms (e.g., succinic acid, adipic acid, sebacic acid, etc.) (with a suitable condensing agent (e.g., sulfuric acid, hydrochloric acid, toluene sulfonic acid, etc.) and an esterifying catalyst being used when the propane diol is reacted with the dicarboxylic acid) to thereby provide an electron acceptor polycondensation polymer of the formula (I).

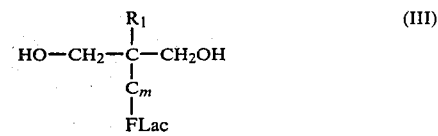
(III)

Such method of polycondensation is well known in the art, but due to the presence of a strong electron acceptor group in the dipropane diol, there exists considerable limitations on the solvent and catalyst that can be used in the process. It is particularly preferred to produce a polyurethane by reacting the propane diol with a diisocyanate in a suitable solvent. It has been found that dioxane is the only solvent that can be used in the reaction system for producing the intended product whereas DMF and DMAC which are commonly used as solvents for formation of urethane and also chlorobenzene and anisole cannot advantageously be used. For instance, the polymer of the present invention can be obtained by the reaction of the propane diol used in Example 1 with the following compounds under reaction conditions shown in the following table.

TABLE

| Difunctional Compound | Solvent | Catalyst | Reaction Temp. (°C.) | Reaction Time, etc. (hour) |
|---|---|---|---|---|
| Ethylene diisocyanate | Dioxane | Dibutyl tin dilaurate | 40 | 2 |
| Hexamethylene diisocyanate | " | Dibutyl tin dilaurate | 60 | 2 |
| Xylylene diisocyanate | " | Dibutyl tin dilaurate | 60 | 2 |
| Adipoyl dichloride | none | none | 70 | 5 (under reduced pressure) |
| Succinoyl dichloride | " | " | 70 | 5 (under reduced pressure) |

Similarly, there are limitations on the synthesis of the propane diol represented by the formula (III) due to the electron acceptor fluorenyl group or basic reaction conditions, and therefore, the most practical method that can be recommended is an acid catalyzed reaction between an electron acceptor fluorenyl carboxylic acid and trimethylol propane, pentaerythritol monoester, monoether or the like. Examples of the compound having the fluorene nucleus used in the synthesis of the propane diol are those having a

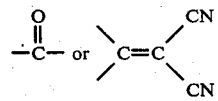

group (including the carbon atom in the fluorene ring) at the 9-position (corresponding to A in formula (II)) and having at the 2-, 4-, 5- and/or 7-position up to 4 of one or more substituents selected from the group consisting of a nitro group, a halogen atom, a cyano group and a trifluoromethyl group, particularly preferred is three nitro groups, and further having a —COOH group or a —COCl group to constitute the divalent connecting group C$_m$. Of these compounds, 4,5,7-trinitro-9-fluorenone-2-carboxylic acid is particularly preferred. The propane diol can effectively be produced by reacting the compound having the fluorene nucleus with an excessively large amount of a triol such as trimethylol propane, trimethylol ethane, pentaerythritol at a temperature of 20° to 30° C. higher than the melting point thereof in the presence of a small amount of esterification catalyst such as sulfuric acid.

Most of the electron acceptor polycondensation polymers that can be produced by the method described above are soluble in a variety of solvents so as to be suitable for forming charge transfer complexes with various electron donors by various methods, and at the same time, the resultant complex as well as the electron acceptor polycondensation polymer from which it has been prepared have high moldability that permits them to be used in a wide variety of applications.

Either a low molecular weight electron donor or a high molecular weight electron donor may be used as a donor which is combined with the electron acceptor polycondensation polymer to form a charge transfer complex which is the second object of this invention. For a basic background concerning charge transfer complexes see H. Kamogawa, *Journal of Polymer Science*, A-1 4 2281 (1966); and M. H. Litt and J. W. Summers, *Journal of Polymer Science*, Polym. Chem. Ed., 11, 1339, 1359 (1973). Charge transfer complexes are found among many compounds, and their charge transferring force (bonding force) arises from the overlap in electron orbitals between the electron donor and the electron acceptor. General properties and types of charge transfer complexes are described in detail in R. Foster, *Organic Charge Transfer Complexes*, Academic Press (1969). In the case of the electron acceptor polycondensation polymer of the present invention, the antibonding $\pi$ orbital of the fluorene nucleus contributes to the bonding in the complex, whereby a so-called $\pi$ type complex is mainly formed.

It is conventionally known that if either of an electron donor and electron acceptor that form a charge transfer complex is bonded to a polymer of vinyl type to increase the molecular weight of the complex, the stability constant of the complex has a tendency to decrease, as is reported in A. Rembaum et al, *Journal of Polymer Science*, A-1, Vol. 6, p. 1955 (1968); M. Hatano et al, *Makromolekular Chemie*, Vol. 175, p. 57, (1974); H. Mikawa et al, *Bulletin of the Chemical Society of Japan*, 48, p. 1362, (1975), and other papers. However, it has now been found that the stability constant of the charge transfer complex formed by an electron acceptor polycondensation polymer according to this invention and a low molecular electron donor is equal to or even higher than when it is formed of low molecular weight electron acceptor and donor.

The only requirement for the low molecular electron donor that can be used to form the charge transfer complex according to this invention is that it has an ionization potential lower than that of the FLac nucleus defined in the formula (I) by 2 eV or more; examples of the suitable low molecular electron donors are N-alkyl carbazoles, naphthalene, dimethyl aniline, anthracene, pyrene, and tetramethylparaphenylenediamine.

One major feature of this invention is a high molecular charge transfer complex formed by combining the electron acceptor polycondensation polymer prepared according to the above-described method of this invention with a high molecular electron donor. Needless to say, the purpose of making a polymer of a charge transfer complex is to permit its shaping in a desired form (e.g., film, powder, etc.) depending upon its use such as in a photoconductor, organic semiconductor, a catalyst, a membrane filter, and an adsorbent for chromatography. The conventional process for making a polymer of a charge transfer complex has not been fully satisfactory because of the above-mentioned decrease in the stability of the resulting complex and insufficient polymerization of the electron acceptor group. However, by making the most of the sophisticated technology accumulated in the art and by using a molecular design concept which avoids low stability of the resulting complex, not only an electron acceptor polycondensation polymer capable of forming a stable complex has been produced but also a stable polymeric charge transfer complex comprising such an electron acceptor polycondensation polymer and a high molecular electron donor.

Any type of electron donor polymer can be used as a polymer capable of forming the above-described high molecular charge transfer complex together with the electron acceptor polycondensation polymer if it contains an electron donor group which like the low molecular weight electron donor described above, has an ionization potential lower than the electron acceptor group FLac of said electron acceptor polycondensation polymer by 2 eV or more. Suitable high molecular electron donors are exemplified by polyvinyl carbazole, poly-2-vinylpyridine, poly-4-vinylpyridine, poly-p-dimethylaminostyrene and copolymers of other vinyl compounds therewith. Needless to say, the high molecular electron donors which can be used in the present invention are not limited to those set forth above, and many polymers having an electron donor group can be used.

In accordance with the molecular design philosophy of this invention, an electron donor polycondensation polymer of similar type defined by the following formula (IV) is also recommended:

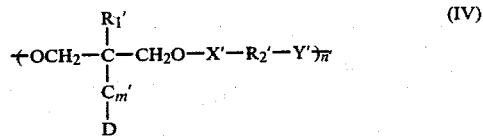

wherein $R'_1$, $R'_2$, $C'_m$, $X'$, $Y'$ and $n'$ are the same as defined in conjunction with $R_1$, $R_2$, $C_m$, $X$, $Y$ and $n$ of the formula (I); D is an electron donor group which preferably has an ionization potential of 10 eV or less. D may be an electron donor group such as a carbazolyl group, a naphthyl group, an anthryl group, a pyrenyl group, a dialkylanilino group, etc. and is typified by a 9-carbazolyl group, a 9-anthryl group, and a 3-pyrenyl group. It is to be understood that, as mentioned before, conventional electron donor polymers of vinyl type can also be used in this invention, and preferred examples of such polymer are poly-(N-vinyl carbazole), poly-(4-vinyl pyridine), poly-(p-dimethylaminostyrene) and copolymers thereof as described in H. Kamogawa, *Journal of Polymer Science*, A-1, 4, 2281 (1966), S, Iwatsuki, K. Arai, *Journal of Polymer Science*, Polym. Chem. Ed., 10, 3329 (1970) and S. Iwatsuki, K. Arai, *Makromolekular Chemie*, 178, 2307 (1977).

The major characteristic of a charge transfer complex comprising high molecular electron donor and acceptor according to this invention consists in the unique photoconductive behavior of the polymeric complex. The conventional charge transfer complex comprising poly-(N-vinyl carbazole) to which is added an electron acceptor compound generally exhibits higher photoconductivity when the negative side is illuminated than when the positive side is illuminated, with conduction occurring as a result of electron movement into holes formed in the carbazole ring. On the other hand, the high molecular charge transfer complex of this invention comprising the high molecular electron acceptor and an high molecular electron donor has been found to be a new photoconductive polymer exhibiting the performance of both a p-type photoconductor and n-type photoconductor in that illumination of the negative side causes a flow of light current at a rate which is not significantly larger than when the positive side is illuminated.

A solution containing the charge transfer complex can be obtained by mixing an organic solution of the electron acceptor polymer with an organic solution of a low molecular electron donor or a high molecular electron donor. By selecting an organic solvent used, the complex can be obtained in the form of a precipitate. Further, by evaporation of the organic solvent, the complex can be obtained in the form of film. Furthermore, the complex can be formed at the interface of one of the two reactants (i.e., the electron acceptor and the electron donor) using a solvent capable of dissolving the other reactant.

These unique characteristics of the photoconductive polymer of this invention means less restricted selection of polarity in corona charging for electrography, thus expanding the scope in which one can select various copying methods such as the direct method, the transfer method, the screen method and the screen transfer method as well as select various combinations of such copying methods with different materials as a toner.

This invention is described hereunder in greater detail by reference to the following examples, which are given for illustrative purpose only and are by no means meant for limiting this invention. In the examples, all percentages are by weight.

EXAMPLE 1

A mixture of 2.7 g of 4,5,7-trinitro-9-fluorenone-2-carboxylic acid and 15 g of trimethylol propane was heated to melt at 80° C. Three drops of concentrated sulfuric acid were added to the mixture and the reaction continued at 80° to 82° C. for 24 hours under stirring. After the reaction, the reaction mixture was transferred into a large amount of ice water to provide about 3.5 g of a crude product. Several recrystallizations from a mixture of tetrahydrofuran and n-hexane and chloroform yielded 40 to 50% of 2'-(4,5,7-trinitro-9-fluorenone-2-carboxy)methyl-2'-ethylpropanediol-1',3' as a pale yellow needle crystal.

m.p.: 148°–150° C.

IR Spectrum: 3400 cm$^{-1}$ ($v$O—H), 1735 ($v$C=O, —COOR), 1715 ($v$C=O), 1540 ($v_{as}$ NO$_2$), 1340 ($v_s$ NO$_2$).

Elemental Analysis for $C_{20}H_{17}N_3O_{11}$: Calcd.(%): C, 50.53; H, 3.60; N, 8.84. Found (%): C, 50.03; H, 3.48; N, 8.68.

NMR Spectrum (in deuterium acetone): δ=0.97 (t, J=8.0 H$_z$, 3H, —CH$_2$CH$_3$); 1.58 (q, J=7.2 H$_z$, 2H, —CH$_2$CH$_3$); 3.68 (s, 4H, —CH$_2$OH×2); 4.46 (s, 2H, —CO$_2$CH$_2$—); 8.60 (d, J=1.6 H$_z$, 1H aromatic hydrogen 1-position); 8.72 (d, J=1.6 H$_z$, 1H aromatic hydrogen 3-position); 8.78 (d, J=2.0 H$_z$, 1H 8-positon); 8.96 (d, J=2.0 H$_z$, 1H 6-position)

A mixture of 1.038 g of the propane diol thus-prepared with 27 mg of dibutyl tin dilaurate was dissolved in 10 ml of dioxane, and to this solution was added under stirring 0.367 g of hexamethylene diisocyanate in the form of a 5 ml dioxane solution, and the reaction continued at 60° C. for 2 hours under stirring. After the reaction, 2 ml of methanol was added to the reaction mixture, which was then transferred into a large amount of n-hexane to provide a precipitate of polyurethane at a yield of 1.3 g (or 93%).

Elemental Analysis for $C_{28}H_{29}N_5O_{13}$: Calcd.(%): C, 52.26; H, 4.54; N, 10.88. Found (%): C, 52.19; H, 4.76; N, 10.40.

Reduced Viscosity (in 1% dioxane): 0.22 at 25° C.

Degree of Polycondensation (n) for formula (I): 106 as determined by gel permeation chromatography IR and NMR Spectra: Same as for formula (V) below

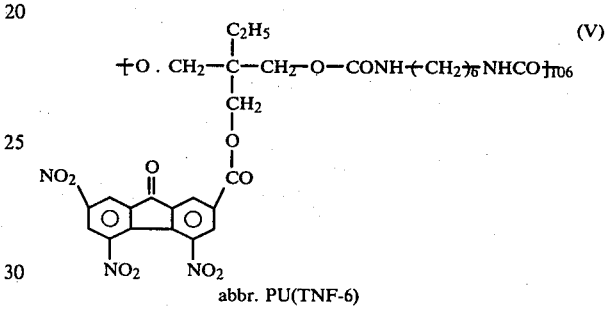

abbr. PU(TNF-6)

EXAMPLE 2

The procedure of Example 1 was repeated to react ethylene diisocyanate with 2'-(4,5,7-trinitro-9-fluorenone-2-carboxy)methyl-2'-ethylpropanediol-1',3' in dioxane at 40° C. to provide an electron acceptor polycondensation polymer corresponding to formula (VI) below at a yield of 87%.

Reduced Viscosity (in 1% dioxane): 0.08 at 25° C.

Degree of Polycondensation (n): estimated at 17

Elemental Analysis for $C_{24}H_{21}N_5O_{13}$: Calcd.(%): C, 49.07; H, 3.60; N, 11.92. Found (%): C, 48.66; H, 3.56; N, 11.92.

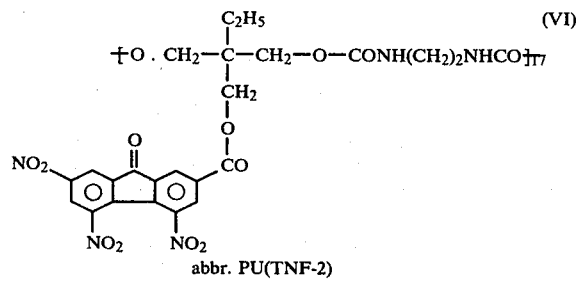

abbr. PU(TNF-2)

EXAMPLE 3

A charge transfer complex was prepared from the electron acceptor polycondensation polymer PU (TNF-2) obtained in Example 2 and a low molecular weight electron donor of the formula (VII) below. The complex exhibited a charge transfer absorption band having maxima at around 460 nm and 560 nm. Its stability constant measured in a dioxane solution was 1.1±0.1 (M$^{-1}$).

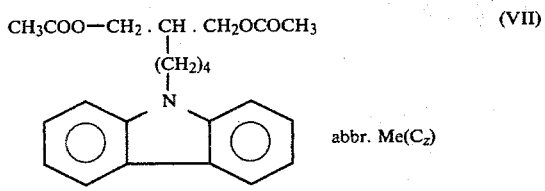

(VII) abbr. Me(C$_z$)

A control complex comprising ME(C$_z$) and 2,4,5-trinitro-9-fluorenone had the stability constant of 0.9±0.1 (M$^{-1}$).

EXAMPLE 4

An equimolar mixture of a propane diol derivative of the formula (VIII) below and dithiophenyl succinate was reacted in a reaction tube under the atmosphere of nitrogen at 140° to 150° C., and the reaction mixture was maintained under reduced pressure (5 to 20 mm Hg) for about 1.5 hours with stirring.

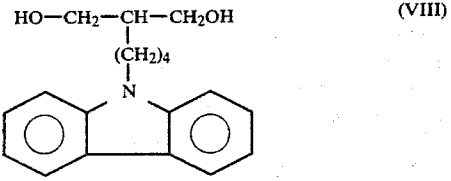

(VIII)

Subsequently, the reaction mixture was held at 160° to 170° C. under 3 mm Hg for 3.5 hours, then at a temperature below 200° C. under a pressure lower than 2 mm Hg for 8 hours to remove the resultant thiophenol in steps. The reaction product was dissolved in tetrahydrofuran at room temperature and injected into n-hexane to obtain a white solid of polypropylene succinate derivative (abbr. PE(C$_z$-2)) at a yield of 90%.

Elemental Analysis for C$_{23}$H$_{25}$NO$_4$: Calcd.(%): C, 72.80; H, 6.64; N, 3.69. Found (%): C, 72.72; H, 6.58; N, 3.76.

Reduced Viscosity (1% tetrahydrofuran): 0.18

Degree of Polycondensation (n): 198 estimated from gel permeation chromatography

EXAMPLES 5 AND 6

The procedure of Example 4 was repeated to react propane diol of the formula (VIII) with dithiophenol adipate and dithiophenol sebacate to form polyesters, respectively. Both products were white polyesters of high purity which were found satisfactory as a high molecular electron donor.

Polypropylene Adipate Derivative: abbr. PE(C$_z$-4)

Elemental Analysis for C$_{25}$H$_{29}$NO$_4$: Calcd.(%): C, 73.69; H, 7.17; N, 3.44. Found (%): C, 71.07; H, 7.07; N, 3.23.

Degree of Polycondensation (n): 81

Reduced Viscosity: 0.37

Polypropylene Sebacate Derivative: abbr. PE(C$_z$-8)

Elemental Analysis for C$_{29}$H$_{37}$NO$_4$: Calcd.(%): C, 75.13; H, 8.04; N, 3.02. Found (%): C, 74.84; H, 8.19; N, 3.07.

Degree of Polymerization (n): 259

Reduced Viscosity: 0.78

EXAMPLES 7 TO 9

High molecular charge transfer complexes were prepared in a dioxane solution from the electron acceptor polycondensation polymer PU(TNF-2) prepared in Example 2 and the electron donor polymers PE(C$_z$-2), PE(C$_z$-4) and PE(C$_z$-8) prepared in Examples 4, 5 and 6, respectively. Each complex exhibited a charge transfer absorption band having maxima at about 460 nm and 560 nm. The stability constants of the complexes were 5.9±0.2 (M$^{-1}$), 5.9±0.3, and 3.4±0.2. Control complexes comprising PE(C$_z$-2), PE(C$_z$-4) and PE(C$_z$-8) plus a low molecular electron donor of the formula (IX) had stability constants of 1.5±0.2, 0.9±0.1 and 0.9±0.1 (M$^{-1}$). Therefore, contrary to the prediction that a complex comprising high molecular electron acceptor and donor has low stability, the high molecular charge transfer complex comprising the system of highly charge-transferable polycondensation polymers according to the molecular design philosophy of this invention was found to be highly stable.

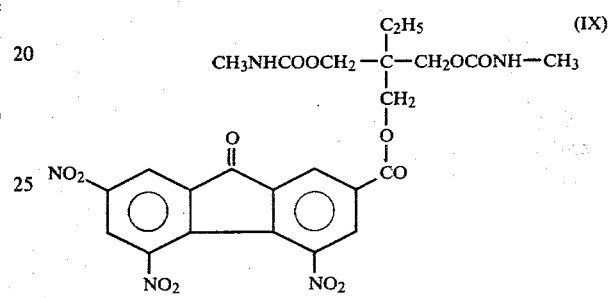

(IX)

EXAMPLE 10

An equimolar mixture of the electron acceptor polycondensation polymer PU(TNF-6) prepared in Example 1 and the high molecular electron donor PE(C$_z$-2) prepared in Example 4 was prepared in dioxane, from which a film was shaped and illuminated with light (400 nm). Measurement of the ratio of dark current (id) and light current (i− negative side, i+ positive side) was i−/id=30 and i+/id=30.

EXAMPLE 11

The procedure of Example 10 was repeated to prepare a charge transfer complex from PU(TNF-6) and poly-(N-vinylcarbazole) as a high molecular electron donor. The complex exhibited i−/id=20 and i+/id=20. A control was prepared from an equimolar mixture of the high molecular electron donor PE(C$_z$-2) and 2,4,5-trinitro-9-fluorenone as a low molecular electron acceptor exhibited a ratio of i−/id in the range from 40 to 50 and a ratio of i+/id of 10.

EXAMPLE 12

$1\times10^{-2}$ mol dioxane solution of the polycondensate (PU(TNF-6)) obtained in Example 1 and $1\times10^{-2}$ mol dioxane solution of the polypropylene succinate derivative PE(C$_z$-2) obtained in Example 4 were mixed at a room temperature to thereby obtain a dioxane solution of a charge transfer complex. This dioxane solution was casted on a glass plate and the dioxane was removed under reduced pressure. Thus, the complex was obtained in the form of a film. When ethylene dichloride was used as a solvent instead of dioxane, the complex was obtained in the form of precipitate.

While the invention has been described in detail and with reference to specific embodiments thereof, it will be apparent to one skilled in the art that various changes and modifications can be made therein without departing from the spirit and scope thereof.

What is claimed is:

1. An electron acceptor polycondensation polymer of the formula (I):

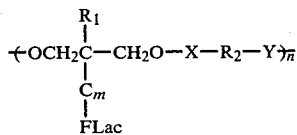

wherein $R_1$ is a hydrogen atom or an alkyl group, an aryl group or an aralkyl group, having not more than 15 carbon atoms; $C_m$ is a divalent connecting group; FLac is an electron acceptor group having a fluorene nucleus; X and Y are a carbonyl group or an acid amide capable of forming a urethane linkage with the oxygen atom of a diol; $R_2$ is a divalent organic residue having not more than 20 carbon atoms; n is a number greater than 10 which represents the degree of polycondensation of the resultant polycondensation polymer.

2. The electron acceptor polycondensation polymer of claim 1, wherein FLac of the formula (I) is a 4,5,7-trinitro-9-oxo-2-fluorenyl group.

3. A high molecular weight charge transfer complex comprising the electron acceptor polycondensation polymer of the formula (I):

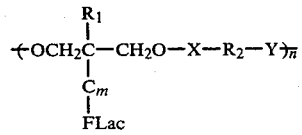

wherein $R_1$ is a hydrogen atom or an alkyl group, an aryl group or an aralkyl group, having not more than 8 carbon atoms; $C_m$ is a divalent connecting group; FLac is an electron acceptor group having a fluorene nucleus; X and Y are a carbonyl group or an acid amide group forming a urethane linkage with the oxygen atom in the diol; $R_2$ is a divalent organic residue having not more than 20 carbon atoms; n is a number greater than 10 which represents the degree of polycondensation of the resultant polycondensation polymer; and an electron donor.

4. The high molecular weight charge transfer complex of claim 3, wherein said electron donor is an electron donor polycondensation polymer of the formula (IV) below:

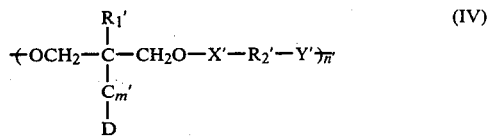

wherein $R'_1$, $C'_m$, $R'_2$, $X'$, $Y'$ and $n'$ are the same as defined for $R_1$, $C_m$, $R_2$, X, Y and n in the formula (I) and D is an electron donor group.

5. The high molecular weight charge transfer complex of claim 4, wherein D is an electron donor group having an ionization potential of 10 eV or less.

6. The high molecular weight charge transfer complex of claim 4, wherein D is selected from the group consisting of a 9-carbazolyl group, a 9-anthryl group, and a 3-pyrenyl group.

7. The high molecular weight charge transfer complex of claim 3, wherein said electron donor is selected from the group consisting of poly(N-vinyl carbazole), poly-(4-vinyl pyridine), poly(p-dimethylaminostyrene) and copolymers thereof.

8. The high molecular weight charge transfer complex of claim 3, wherein said electron donor is poly-(N-vinylcarbazole).

9. The high molecular weight charge transfer complex of claim 3, wherein the electron donor is a high molecular electron donor, said charge transfer complex exhibiting a substantially equal level of performance either as a p-type photoconductor or as an n-type photoconductor.

10. A process for preparing an electron acceptor polycondensation polymer which comprises reacting propane diol containing a 4,5,7-trinitro-9-oxo-2-fluorenyl group and is represented by the formula below with a diisocyanate:

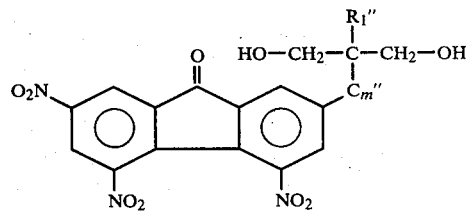

wherein $R''_1$ and $C''_m$ are the same as defined for $R_1$ and $C_m$ in claim 1.

* * * * *